United States Patent
Bicksler et al.

(10) Patent No.: US 7,358,139 B2
(45) Date of Patent: Apr. 15, 2008

(54) METHOD OF FORMING A FIELD EFFECT TRANSISTOR INCLUDING DEPOSITING AND REMOVING INSULATIVE MATERIAL EFFECTIVE TO EXPOSE TRANSISTOR GATE CONDUCTIVE MATERIAL BUT NOT TRANSISTOR GATE SEMICONDUCTOR MATERIAL

(75) Inventors: Andrew R. Bicksler, Boise, ID (US); Sukesh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/490,712

(22) Filed: Jul. 20, 2006

(65) Prior Publication Data

US 2006/0258103 A1    Nov. 16, 2006

Related U.S. Application Data

(62) Division of application No. 10/837,428, filed on Apr. 29, 2004, now Pat. No. 7,112,491, which is a division of application No. 10/061,739, filed on Jan. 31, 2002, now Pat. No. 6,830,975.

(51) Int. Cl.
*H01L 21/336* (2006.01)

(52) U.S. Cl. ............... 438/265; 438/592; 438/595; 257/E21.404

(58) Field of Classification Search ........ 438/257–267, 438/584–596; 257/E21.404
See application file for complete search history.

(56) References Cited

U.S. PATENT DOCUMENTS

| | | | |
|---|---|---|---|
| 4,755,478 A | 7/1988 | Abernathey et al. | |
| 4,901,128 A | 2/1990 | Sunami et al. | |
| 5,063,168 A | 11/1991 | Vora | |
| 5,278,438 A | 1/1994 | Kim et al. | |
| 5,420,060 A * | 5/1995 | Gill et al. | 438/261 |
| 5,691,212 A | 11/1997 | Tsai et al. | |
| 6,033,963 A | 3/2000 | Huang et al. | |
| 6,117,743 A * | 9/2000 | Yeh et al. | 438/301 |
| 6,156,602 A | 12/2000 | Shao et al. | |
| 6,303,494 B1 * | 10/2001 | Yeo et al. | 438/653 |
| 6,346,438 B1 | 2/2002 | Yagishita et al. | |
| 6,830,975 B2 | 12/2004 | Bicksler et al. | |

OTHER PUBLICATIONS

Microchip Fabrication: A Practical Guide to Semiconductor Processing; Van Zant, Peter; 4th ed., 2000, pp. 303-305 and 401-402.

* cited by examiner

*Primary Examiner*—Marcos Pizarro
(74) *Attorney, Agent, or Firm*—Wells St. John P.S.

(57) ABSTRACT

The invention includes methods of forming field effect transistors. In one implementation, a method of forming a field effect transistor having a gate comprising a conductive metal or metal compound received over conductively doped semiconductive material includes forming transistor gate semiconductive material into a gate line over a semiconductive material channel region. The gate line includes semiconductive material sidewalls. The semiconductive material sidewalls of the gate line are oxidized. After the oxidizing, at least one of a conductive metal or metal compound is formed in electrical connection with the transistor gate semiconductive material to comprise a substantially coextensive elongated portion of a final construction of the gate line of the field effect transistor being formed.

10 Claims, 6 Drawing Sheets

METHOD OF FORMING A FIELD EFFECT TRANSISTOR INCLUDING DEPOSITING AND REMOVING INSULATIVE MATERIAL EFFECTIVE TO EXPOSE TRANSISTOR GATE CONDUCTIVE MATERIAL BUT NOT TRANSISTOR GATE SEMICONDUCTOR MATERIAL

RELATED PATENT DATA

This patent resulted from a divisional application of U.S. patent application Ser. No. 10/837,428, filed Apr. 29, 2004, entitled "Methods of Forming Field Effect Transistors Including Floating Gate Field Effect Transistors", naming Andrew R. Bicksler and Sukesh Sandhu as inventors, and which is now U.S. Pat. No. 7,112,491, which resulted from a divisional application of U.S. patent application Ser. No. 10/061,739, filed Jan. 31, 2002, entitled "Method of Forming Field Effect Transistors Comprising at Least One of a Conductive Metal or Metal Compound in Electrical Connection with Transistor Gate Semiconductive Material", naming Andrew R. Bicksler and Sukesh Sandhu as inventors, and which is now U.S. Pat. No. 6,830,975, the disclosures of which are incorporated by reference.

TECHNICAL FIELD

This invention relates to methods of forming field effect transistors, including floating gate transistors.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

One method of forming a floating gate construction is as follows. A gate dielectric layer is formed over semiconductive material. A floating gate layer, for example conductively doped polysilicon, is formed over the gate dielectric layer. Another gate dielectric layer is formed over the conductively doped polysilicon layer. An example construction includes three layers, for example comprising silicon oxide, silicon nitride and silicon oxide. Control gate material is formed thereover. Such might include conductively doped semiconductive material having a higher conductive metal or metal compound layer formed thereover. Typically, an insulating capping layer is formed over the conductive metal or metal compound layer. The floating gate layer is typically partially patterned prior to the provision of the control gate layer thereover such that discrete floating gates will ultimately be provided in the elongated floating gate line construction being formed. After forming the insulating capping layer, the entire construction is thereafter patterned, typically by subtractive etching, to form a desired elongated floating gate line. Source/drain implants are thereafter typically conducted.

In most applications, the substrate is ultimately oxidized to repair source/drain damage from the diffusion or other implant of impurities therein, and also effective to oxidize the sidewalls of at least the semiconductive material of the floating gate and control gate. This typically creates silicon dioxide bulges on the sidewalls of such material.

In certain circumstances where, for example, the metal or metal compound portion of the control gate material is predominantly tungsten, projecting filaments or dendrite-like projections can form from the tungsten, which is undesirable. The following invention was motivated in addressing the above issues, although such is in no way so limited. Methodical aspects of the invention are seen to have applicability to any integrated circuitry and in the fabrication of any field effect transistor, unless a claim is otherwise literally limited. The invention is limited only by the accompanying claims as literally worded without limiting reference to the specification, and in accordance with the doctrine of equivalents.

SUMMARY

The invention includes methods of forming field effect transistors. In one implementation, a method of forming a field effect transistor having a gate comprising a conductive metal or metal compound received over conductively doped semiconductive material includes forming transistor gate semiconductive material into a gate line over a semiconductive material channel region. The gate line includes semiconductive material sidewalls. The semiconductive material sidewalls of the gate line are oxidized. After the oxidizing, at least one of a conductive metal or metal compound is formed in electrical connection with the transistor gate semiconductive material to comprise a substantially coextensive elongated portion of a final construction of the gate line of the field effect transistor being formed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

First embodiments of forming a field effect transistor in accordance with certain aspects of the invention are initially described with reference to FIGS. 1-9. The description proceeds initially with reference to aspects of forming a floating gate field effect transistor. However, it will be appreciated by the artisan that the invention, of course, has applicability to field effect transistors that do not necessarily employ floating gates.

Figure 1:
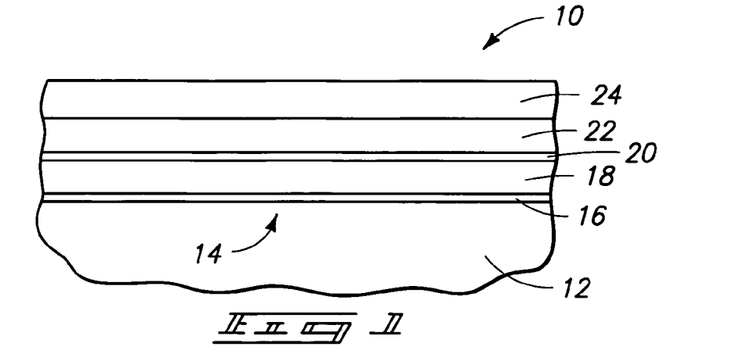
FIG. 1 is a diagrammatic perspective view of a semiconductor wafer fragment/section in process in accordance with an aspect of the invention.

FIG. 1 depicts a semiconductor wafer fragment 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. For purposes of the continuing discussion, semiconductor substrate 12 can be considered as comprising a semiconductive material channel region 14. Region 14 in the illustrated embodiment comprises bulk semiconductive material, but silicon-on-insulator and other existing or yet-to-be-developed constructions are also, of course, contemplated.

A gate dielectric layer 16 is formed over substrate 12. One exemplary material is silicon dioxide. Floating gate semiconductive material 18 is formed over (and "on", as shown) gate dielectric layer 16, and accordingly, over semiconductive material channel region 14. An exemplary material is conductively doped polysilicon deposited to an exemplary thickness range of from 50 Angstroms to 900 Angstroms. A dielectric layer 20 is formed thereover. An example preferred construction for layer 20 comprises a composite of three layers of silicon dioxide, silicon nitride and silicon dioxide. An exemplary thickness range for layer 20 is from 50 Angstroms to 300 Angstroms. A transistor gate semiconductive material 22 is formed over dielectric layer 20. In the described embodiment, such will comprise control gate semiconductive material, with conductively doped polysilicon being but one example. A masking material 24 is formed over transistor gate semiconductive material 22. An exemplary thickness range for masking material 24 is from 500 Angstroms to 2000 Angstroms. In the preferred described embodiment, masking material 24 may ultimately to be totally removed from the wafer, and accordingly, could be either insulative or conductive. If insulative, exemplary preferred materials for masking material 24 include silicon dioxide and silicon nitride. Preferred exemplary conductive materials for masking material 24 include conductive compounds that do not oxidize easily (i.e., $WSi_x$), but are less preferred than the above-described insulative silicon dioxide and silicon nitride materials.

Figure 2:
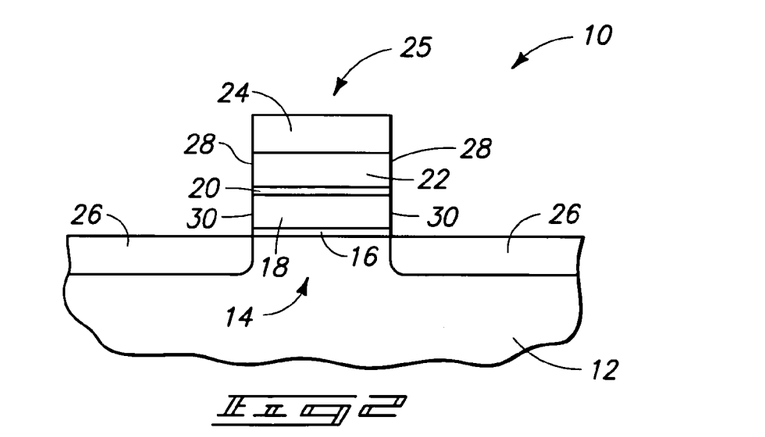
FIG. 2 is a view of the FIG. 1 wafer fragment at a processing step subsequent to that shown by FIG. 1.

Referring to FIG. 2, and in a preferred common masking step, floating gate semiconductive material 18 and control gate semiconductive material 22 are patterned into a desired gate line shape 25. Preferred processes for doing so include existing photolithography and subsequent subtractive etch. Of course, any other existing or yet-to-be-developed technology is also contemplated. Source/drain implants 26 are illustrated. In one embodiment, a highest dose source/drain implant for the floating gate field effect transistor is formed at this time. For purposes of the continuing discussion, floating gate material 18 can be considered as having floating gate semiconductive material sidewalls 30, and control gate material 22 can be considered as having control gate semiconductive material sidewalls 28.

Such provides but one example of forming transistor gate semiconductive material into a gate line over a semiconductive material channel region, with the gate line comprising semiconductive material sidewalls. In the initially described preferred embodiment, such is in the form of control gate material of a floating gate field effect transistor, although fabrication of any transistor gate semiconductive material into any field effect transistor gate line, whether existing or yet-to-be-developed, is contemplated in accordance with the literal wording of the claims.

Figure 3:
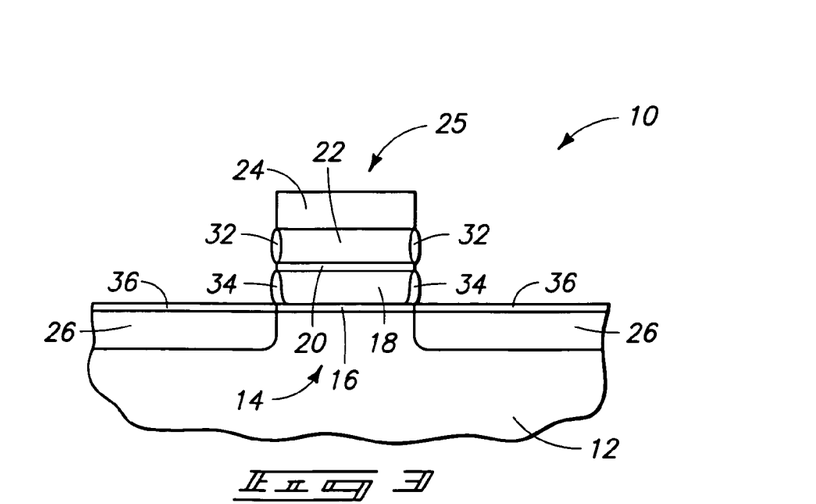
FIG. 3 is a view of the FIG. 2 wafer fragment at a processing step subsequent to that shown by FIG. 2.

Referring to FIG. 3, floating gate semiconductive material sidewalls 30 and control gate semiconductive material sidewalls 28 are oxidized in the same or common oxidizing step. In the preferred embodiment, such forms the illustrated oxide regions 32 and 34, which have a center-bulging shape.

Preferably, the oxidizing is effective to grow such oxide regions 32, 34 to have a maximum thickness of at least 30 Angstroms. Such oxidizing will also typically form an oxide layer 36 over the source/drain regions. Exemplary processes for forming such regions include using $O_2$ and/or $H_2O$ at a temperature of from about 900° C. to about 1100° C. and a pressure from about 100 Torr to atmospheric. Further by way of example only, another process includes an ambient comprising $H_2$, $H_2O$ and Ar at from about 700° C. to about 1000° C. and a pressure from about 10 Torr to about atmospheric.

Figure 4:
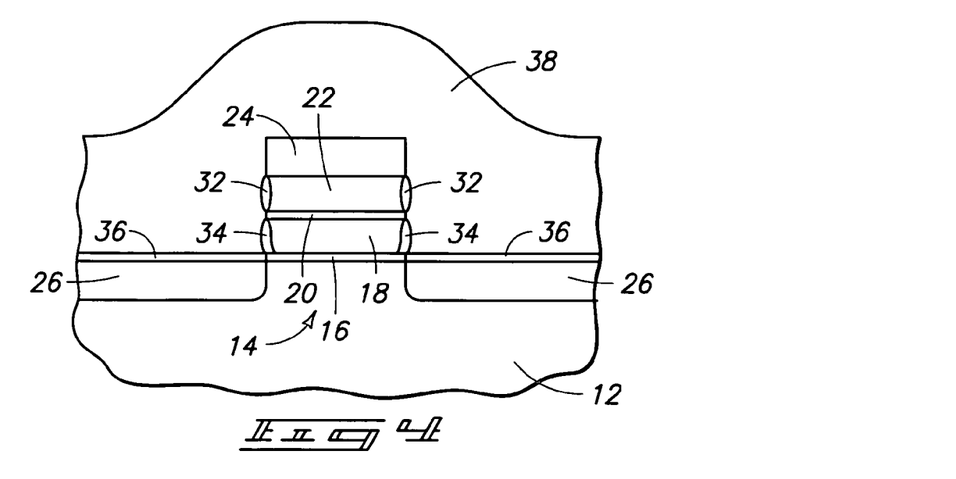
FIG. 4 is a view of the FIG. 3 wafer fragment at a processing step subsequent to that shown by FIG. 3.

Referring to FIG. 4, insulative material 38 is deposited over gate line 25, including patterned masking material 24. An exemplary preferred material is borophosphosilicate glass.

Figure 5:
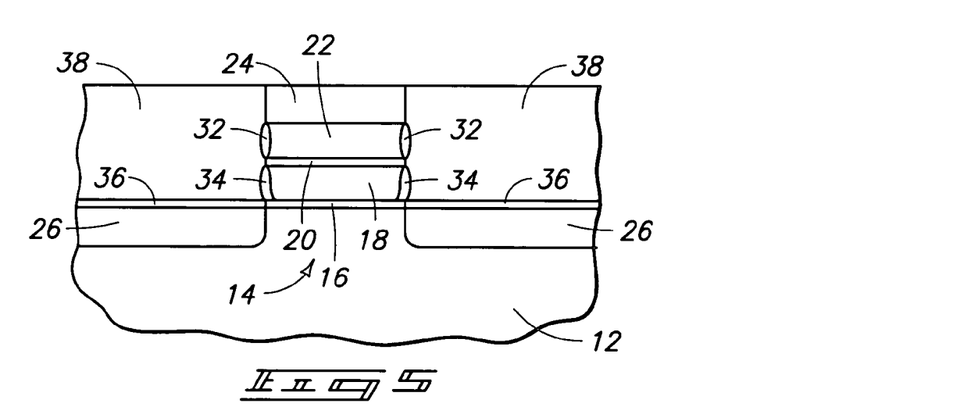
FIG. 5 is a view of the FIG. 4 wafer fragment at a processing step subsequent to that shown by FIG. 4.

Referring to FIG. 5, masking material 24 of gate line 25 is exposed through insulative material 38. Exemplary preferred techniques for conducting the same include polishing, such as mechanical polishing, chemical polishing and chemical-mechanical polishing. Further, such construction might be fabricated by resist etchback, other chemical etching or any other technique whether existing or yet-to-be-developed.

Figure 6:
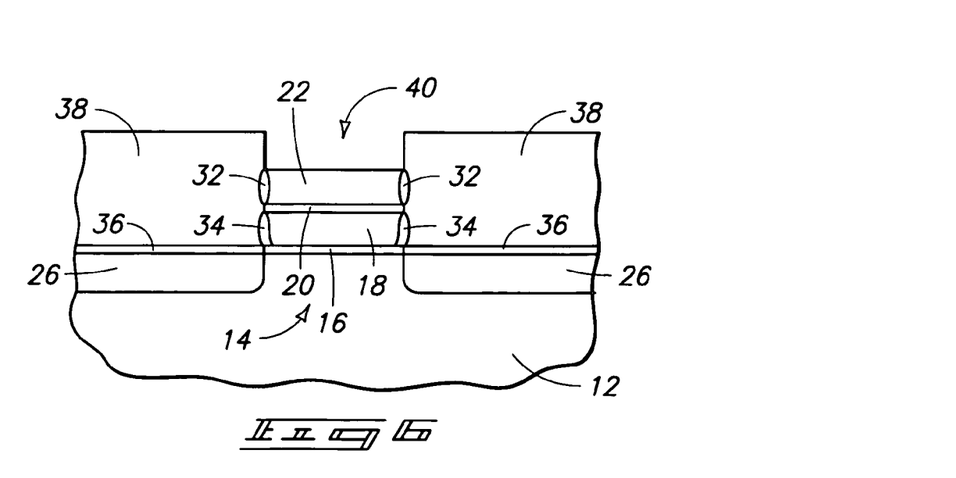
FIG. 6 is a view of the FIG. 5 wafer fragment at a processing step subsequent to that shown by FIG. 5.

Referring to FIG. 6, masking material 24 has been removed effective to form a trough line 40 within insulative material 38 over transistor gate semiconductive material 22. In the illustrated and preferred embodiment, such removing removes all of the masking material which was remaining over transistor gate semiconductive material 22. However, such removing might be conducted to not remove all of the masking material remaining overlying transistor gate semiconductive material 22. For example, and by way of example only, where masking material 24 comprises a conductive material which might remain as part of the finished construction, some of such masking material might remain over transistor gate semiconductive material 22. Where masking material 24 comprises, for example, silicon nitride, material 38 comprises BPSG and semiconductive material 22 comprises conductively doped polysilicon, an exemplary chemistry for etching material 24 selectively relative to such stated materials includes a mixture of $CH_2F_2$, $CF_4$ and He. Another exemplary chemistry includes phosphoric acid at from about 100° C. to about 200° C.

Figure 7:
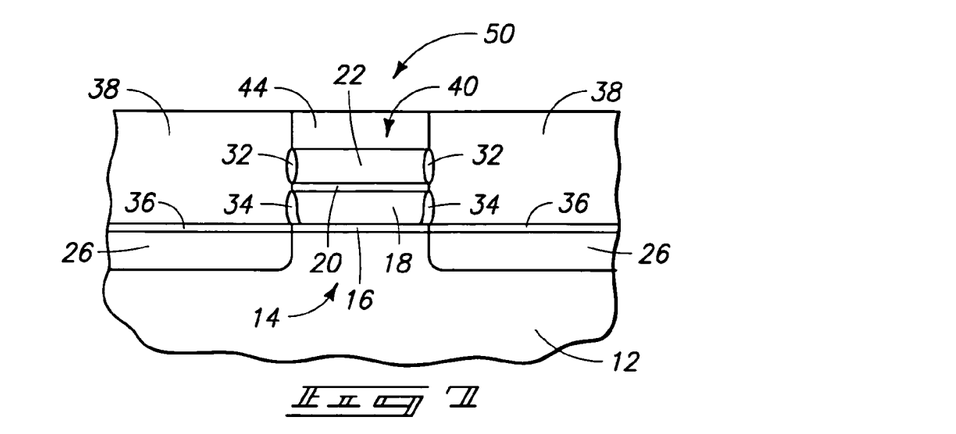
FIG. 7 is a view of the FIG. 6 wafer fragment at a processing step subsequent to that shown by FIG. 6.

Referring to FIG. 7, at least one of a conductive metal or metal compound 44 is formed in electrical connection with transistor gate semiconductive material 22 and, in the illustrated preferred embodiment, directly in contact therewith, within trough line 40 to include or comprise a substantially co-extensive elongated portion of what will be a final construction of the gate line of the field effect transistor being formed. Such forms an exemplary floating gate transistor construction 50. Material 44 might comprise only a conductive metal, only a conductive metal compound, or a combination thereof. Regardless, exemplary materials include elemental tungsten, conductive nitride compounds, and silicides. In the context of this document, a "conductive metal" includes an elemental metal, a mixture of elemental metals and/or elemental metal alloys.

Figure 8:
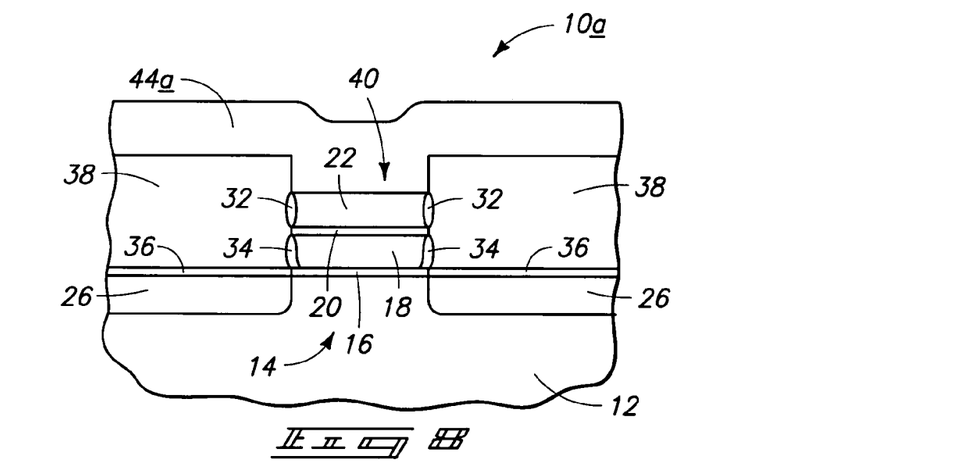
FIG. 8 is an alternate view of the FIG. 6 wafer fragment at an alternate processing step subsequent to that shown by FIG. 6.
Figure 9:
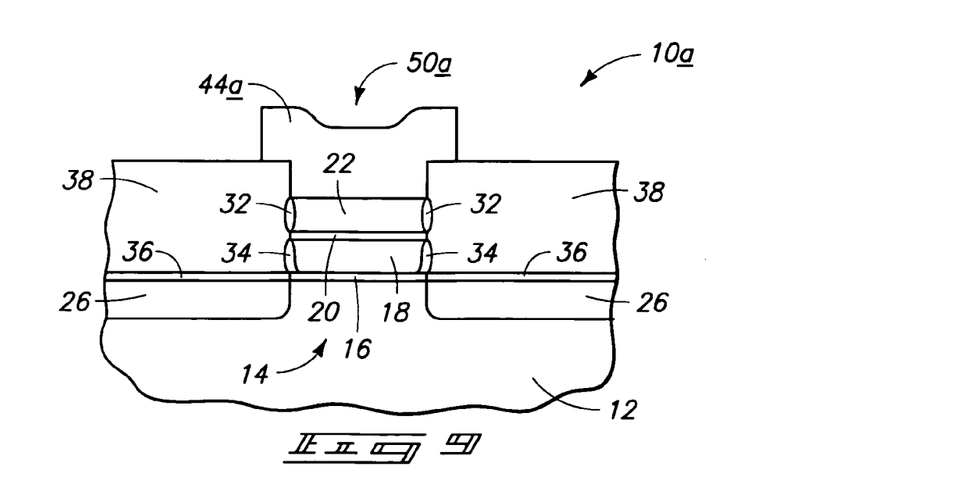
FIG. 9 is a view of the FIG. 8 wafer fragment at a processing step subsequent to that shown by FIG. 8.

Conductive material 44 might be formed in any manner of possible existing or yet-to-be-developed methods. One example includes selective formation/deposition of such material on the transistor gate semiconductive material 22. For example, and by way of example only, elemental tungsten can be selectively deposited on polycrystalline silicon using $SiH_4$ and $WF_6$ at a temperature of from about 300° C. to about 500° C. and a pressure from about 50 mTorr to about 500 mTorr, and as disclosed in U.S. Pat. No. 6,033, 963. Another exemplary method of forming the illustrated FIG. 7 construction would be to deposit the conductive metal and/or metal compound, and then chemically, mechanically, or chemical-mechanically polishing it, and without photolithographic patterning of it. Further by way of example only, another method includes deposition of the conductive metal and/or metal compound followed by patterning and subtractive etching of it. Such is illustrated with respect to FIGS. 8 and 9 in an exemplary alternate embodiment 10a. Like numerals are utilized from the first described embodiment, with differences being indicated with the suffix "a". FIG. 8 depicts the deposition of a conductive metal and/or metal compound layer 44a. FIG. 9 depicts the patterning, for example photolithographic patterning, and subtractive etch of layer 44a of FIG. 8. Such can result in an exemplary alternate embodiment floating gate field effect transistor gate line 50a.

The above-described processing contemplates the fabrication of any field effect transistor having a gate comprising a conductive metal or metal compound received over conductively doped semiconductive material, including both floating gate field effect transistor gate constructions and field effect transistor gate constructions which are partially or totally void of floating gates.

Figure 10:
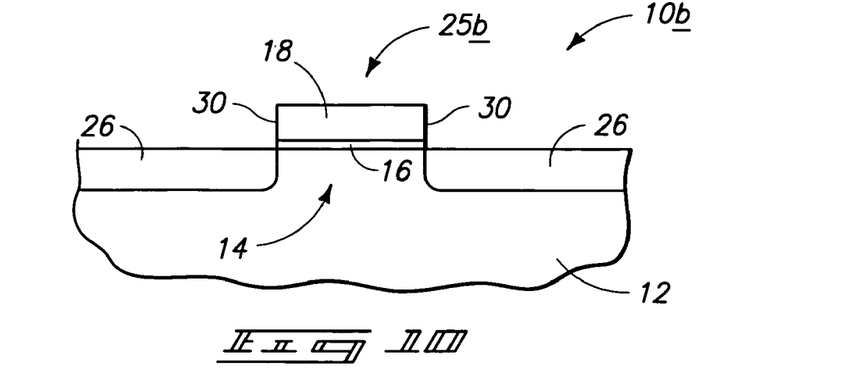
FIG. 10 is a diagrammatic perspective view of an alternate embodiment semiconductor wafer fragment/section in process in accordance with an aspect of the invention.

By way of example only, an exemplary alternate embodiment 10b is described with reference to FIGS. 10-16. Like numerals from the first embodiment are utilized where appropriate, with differences being indicated by the suffix "b" or with different numerals. FIG. 10 depicts the formation of transistor gate semiconductive material 18 into a gate line construction 25b over a semiconductive material channel region 14, and including semiconductive material sidewalls 30.

Figure 11:
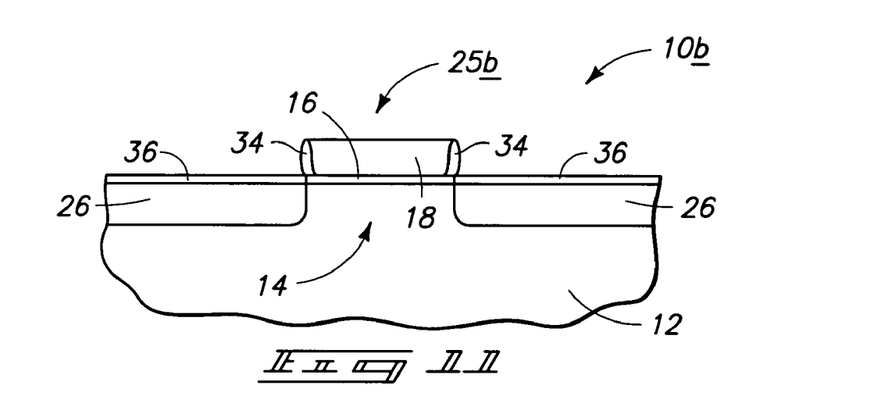
FIG. 11 is a view of the FIG. 10 wafer fragment at a processing step subsequent to that shown by FIG. 10.

Referring to FIG. 11, semiconductive material sidewalls 30 have been oxidized. In the depicted preferred embodiment, such forms oxide regions 34 and oxide layer 36.

Figure 12:
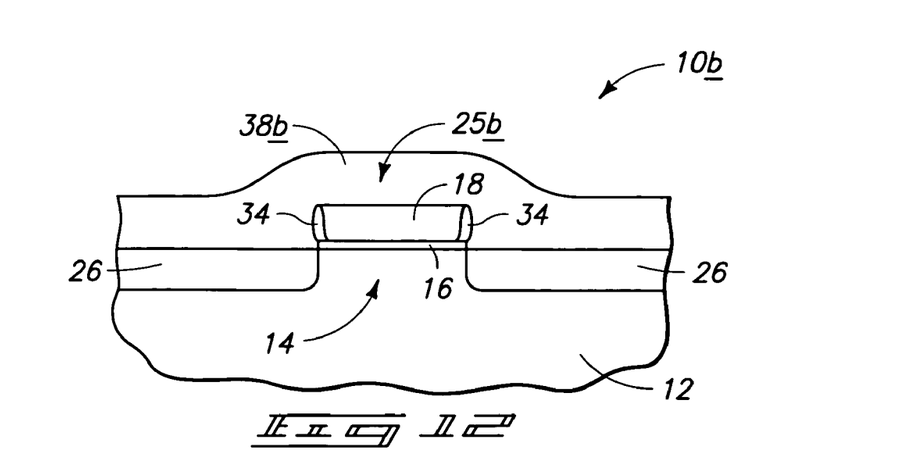
FIG. 12 is a view of the FIG. 11 wafer fragment at a processing step subsequent to that shown by FIG. 11.

Referring to FIG. 12, an insulative material 38b is deposited over gate line 25b.

Figure 13:
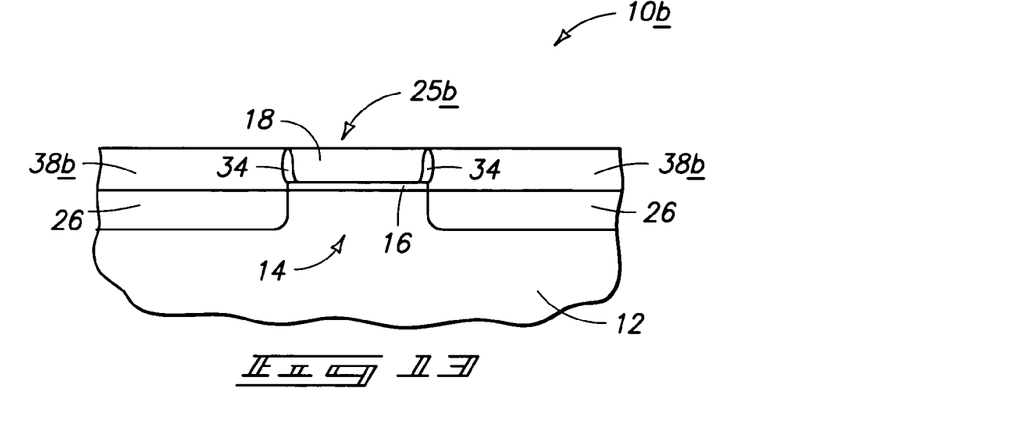
FIG. 13 is a view of the FIG. 12 wafer fragment at a processing step subsequent to that shown by FIG. 12.

Referring to FIG. 13, insulative material 38b has been removed effective to expose gate line 25b. In the depicted and preferred embodiment, the removing exposes transistor gate semiconductive material 18. By way of example only, masking material, for example the masking material 24 of the first described embodiment, might be fabricated over semiconductive material 18 prior to the oxidizing, with such removing also comprising the removing of the masking material. Masking material might also be formed on the FIG. 13 construction. The removing of insulative material 38b to produce the illustrated FIG. 13 construction might occur by any of the processes described above, with a non-lithography chemical-mechanical polishing being preferred. In the illustrated and preferred embodiment, such removing also increases the planarity of an outer surface of insulative material 38b from what it was prior to said removing, for example as shown in FIG. 13 as compared to FIG. 12.

Figure 14:
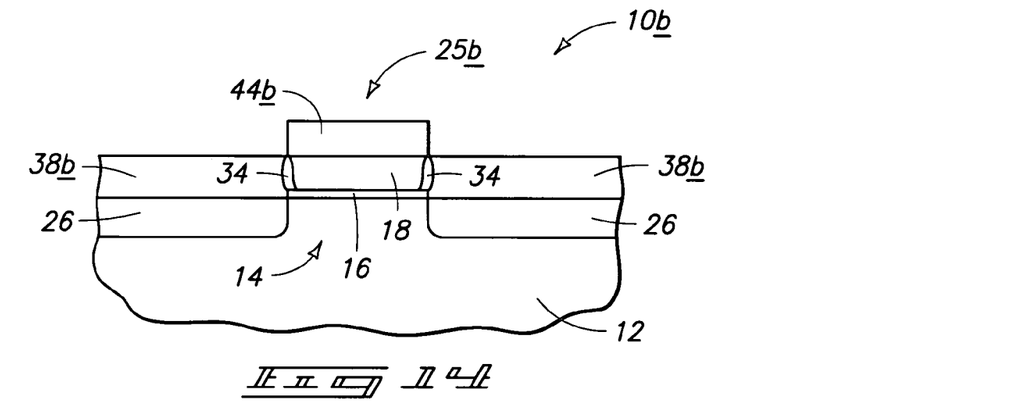
FIG. 14 is a view of the FIG. 13 wafer fragment at a processing step subsequent to that shown by FIG. 13.
Figure 15:
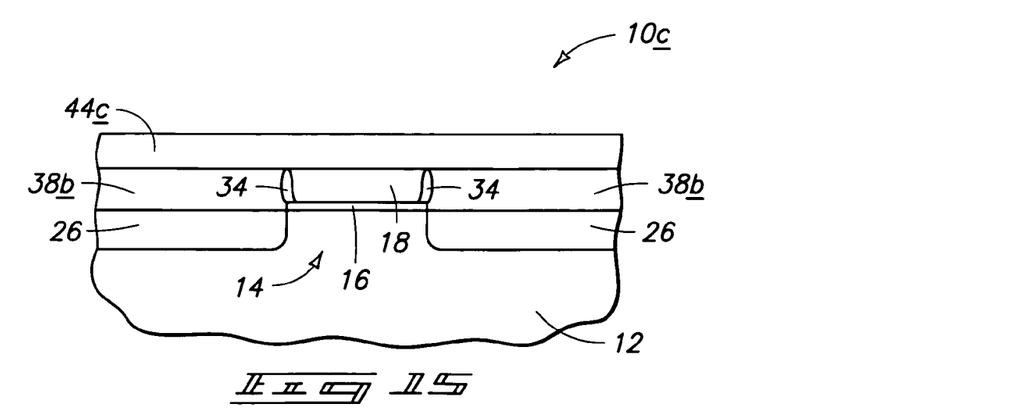
FIG. 15 is an alternate view of the FIG. 13 wafer fragment at an alternate processing step subsequent to that shown by FIG. 13.
Figure 16:
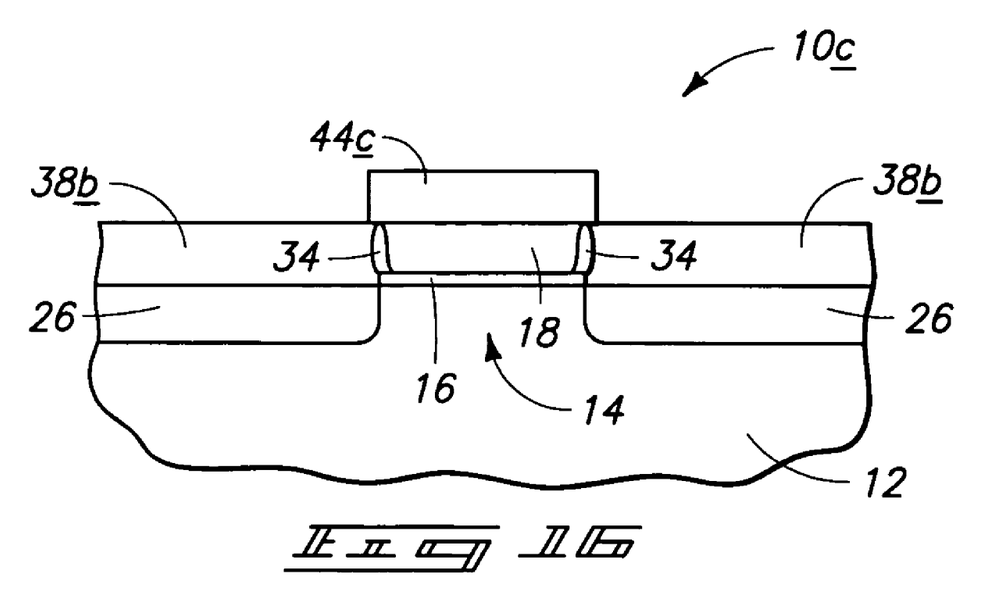
FIG. 16 is a view of the FIG. 15 wafer fragment at a processing step subsequent to that shown by FIG. 15.

Referring to FIG. 14, at least one of a conductive metal or metal compound 44b is formed in electrical connection with transistor gate semiconductive material 18, and here shown formed in direct contact therewith, to comprise a substantially co-extensive elongated portion of a final construction of the gate line of the field effect transistor being formed. Such might be formed, as illustrated in FIG. 14, by the selective formation of the metal and/or metal compound on transistor gate semiconductive material 18. Alternately and by way of example only, FIGS. 15 and 16 illustrate exemplary processing whereby a metal and/or metal compound layer 44c is deposited (FIG. 15) and subtractively patterned and etched to produce a region 44c (FIG. 16).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor having a gate comprising a conductive metal or metal compound received over conductively doped semiconductive material, the method comprising:

forming transistor gate semiconductive material and conductive material which contacts the semiconductive material thereover into a gate line over a semiconductive material channel region, the gate line comprising semiconductive material sidewalls;

oxidizing the semiconductive material sidewalls of the gate line;

after the oxidizing, depositing insulative material over the gate line;

after the depositing, removing the insulative material effective to expose the transistor gate conductive material but not the transistor gate semiconductive material; and after the removing, forming at least one of a conductive metal or metal compound in electrical connection with the transistor gate semiconductive material to comprise a substantially coextensive elongated portion of a final construction of the gate line of the field effect transistor being formed.

2. The method of claim 1 wherein the forming the at least one of a conductive metal or metal compound to comprise a substantially coextensive elongated portion of a final construction of the gate line of the field effect transistor being formed comprises deposition of said at least one and patterning and subtractively etching of said at least one.

3. The method of claim 1 wherein the field effect transistor gate line does not comprise a floating gate.

4. The method of claim 1 further comprising forming masking material over the transistor gate semiconductive material prior to the removing.

5. The method of claim 1 further comprising forming masking material over the transistor gate semiconductive material, the removing comprising removing the masking material.

6. The method of claim 5 wherein the masking material is conductive.

7. The method of claim 6 wherein the masking material comprises $WSi_x$.

8. The method of claim 5 wherein the masking material is insulative.

9. The method of claim 8 wherein the masking material comprises silicon dioxide.

10. The method of claim 8 wherein the masking material comprises silicon nitride.

* * * * *

UNITED STATES PATENT AND TRADEMARK OFFICE
CERTIFICATE OF CORRECTION

PATENT NO. : 7,358,139 B2  Page 1 of 1
APPLICATION NO. : 11/490712
DATED : April 15, 2008
INVENTOR(S) : Bicksler et al.

It is certified that error appears in the above-identified patent and that said Letters Patent is hereby corrected as shown below:

On the title page, item (54), in "Title", in column 1, line 6, delete "SEMICONDUCTOR" and insert -- SEMICONDUCTIVE --, therefor.

In column 1, line 6, delete "SEMICONDUCTOR" and insert -- SEMICONDUCTIVE --, therefor.

Signed and Sealed this

First Day of July, 2008

JON W. DUDAS
*Director of the United States Patent and Trademark Office*